(12) United States Patent
Hsieh et al.

(10) Patent No.: US 12,101,881 B2
(45) Date of Patent: Sep. 24, 2024

(54) CIRCUIT BOARD ASSEMBLY

(71) Applicant: Unimicron Technology Corporation, Taoyuan (TW)

(72) Inventors: Ching-Ho Hsieh, Taoyuan (TW); Ming-Hsing Wu, Taoyuan (TW); Kuei-Sheng Wu, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 0 days.

(21) Appl. No.: 18/455,782

(22) Filed: Aug. 25, 2023

(65) Prior Publication Data

US 2023/0413441 A1 Dec. 21, 2023

Related U.S. Application Data

(62) Division of application No. 17/529,410, filed on Nov. 18, 2021, now Pat. No. 11,825,604.

(30) Foreign Application Priority Data

Oct. 14, 2021 (TW) .................................. 110138172

(51) Int. Cl.
*H05K 1/14* (2006.01)
*H01R 12/79* (2011.01)
*H05K 1/02* (2006.01)

(52) U.S. Cl.
CPC ............. *H05K 1/144* (2013.01); *H01R 12/79* (2013.01); *H05K 1/028* (2013.01); *H05K 2201/042* (2013.01); *H05K 2201/09063* (2013.01); *H05K 2201/10189* (2013.01); *H05K 2201/2018* (2013.01)

(58) Field of Classification Search
CPC .. H05K 1/144; H05K 1/028; H05K 2201/042; H05K 2201/09063; H05K 2201/10189; H01R 12/79
USPC ........................................................ 361/749
See application file for complete search history.

(56) References Cited

U.S. PATENT DOCUMENTS

| 2002/0016092 A1* | 2/2002 | Dibene, II | ............. H05K 3/368 439/74 |
| 2004/0260382 A1* | 12/2004 | Fogarty | ..................... A61F 2/07 623/1.11 |
| 2008/0113525 A1* | 5/2008 | Tzur | ....................... G06F 1/187 439/55 |

(Continued)

FOREIGN PATENT DOCUMENTS

CN 112261775 A * 1/2021 ........... H05K 1/0206

*Primary Examiner* — Andargie M Aychillhum
(74) *Attorney, Agent, or Firm* — Best & Flanagan LLP

(57) ABSTRACT

A circuit board assembly is provided and includes a first circuit board, a second circuit board and a first connecting module. The first connecting module includes a first connecting wire, a first connector and a second connector. The first circuit board includes a first processor, and the second circuit board includes a second processor. One end of the first connector is connected to one end of the first connecting wire, and the other end of the first connector is connected to the first circuit board. One end of the second connector is connected to the other end of the first connecting wire, and the other end of the second connector is connected to the second circuit board. The first connector is adjacent to the first processor, and the second connector is adjacent to the second processor.

8 Claims, 11 Drawing Sheets

(56) References Cited

U.S. PATENT DOCUMENTS

| | | | |
|---|---|---|---|
| 2011/0215188 A1* | 9/2011 | Lalau | A47K 10/36 |
| | | | 242/564.1 |
| 2015/0311612 A1* | 10/2015 | Qiao | H01R 12/75 |
| | | | 439/629 |
| 2017/0018528 A1* | 1/2017 | Nabekura | H01L 23/49838 |

* cited by examiner

CIRCUIT BOARD ASSEMBLY

CROSS-REFERENCE TO RELATED APPLICATIONS

The present disclosure is a divisional application of U.S. application Ser. No. 17/529,410, filed on Nov. 18, 2021, entitled "Circuit Board Assembly", which claims priority to Taiwanese Application No. 110138172, filed Oct. 14, 2021, the contents of which are hereby incorporated by reference herein in their entirety.

FIELD OF THE DISCLOSURE

The present disclosure relates to a circuit board assembly, and more particularly to a circuit board assembly for reducing the signal transmission path.

BACKGROUND OF THE INVENTION

Please refer to FIG. 1. FIG. 1 illustrates a traditional circuit board assembly 10. In the server of the conventional data center, all signals of each circuit board 11 are transmitted through a backplane 12 to another circuit board 11, resulting in overlong signal transmission. Therefore, it has negative impacts on the high-frequency and the high-speed data transmissions.

Furthermore, each circuit board 11 is connected to the backplane 12 by at least one backplane connector 13. However, adopting multiple backplane connectors 13 results in low quality of high-frequency transmission and high overall manufacturing cost of the circuit board assembly 10.

Therefore, how to design a circuit board assembly for reducing the signal transmission path is worth considering for a person having ordinary skill in the art.

SUMMARY OF THE INVENTION

The objective of the present disclosure is providing a circuit board assembly for reducing the signal transmission path to improve the high-frequency and the high-speed data transmissions and lower the manufacturing cost thereof.

To achieve the foregoing and other objects, a circuit board assembly is provided and includes a first circuit board, a second circuit board and a first connecting module. The first connecting module includes a first connecting wire, a first connector and a second connector. The first circuit board includes a first processor, and the second circuit board includes a second processor. Furthermore, one end of the first connector is connected to one end of the first connecting wire, and the other end of the first connector is connected to the first circuit board. In addition, one end of the second connector is connected to the other end of the first connecting wire, and the other end of the second connector is connected to the second circuit board. The first connector is adjacent to the first processor, and the second connector is adjacent to the second processor.

To achieve the foregoing and other objects, a circuit board assembly of another embodiment is provided and includes a first circuit board, a second circuit board and a first connecting module. The first connecting module includes a first connecting wire, a first connector and a second connector. The first circuit board includes a first processor, and the second circuit board includes a second processor and at least one second through hole. The first connecting wire passes through the second through hole. Furthermore, one end of the first connector is connected to one end of the first connecting wire, and the other end of the first connector is connected to the first circuit board. In addition, one end of the second connector is connected to the other end of the first connecting wire, and the other end of the second connector is connected to the second circuit board. The first connector is adjacent to the first processor, and the second connector is adjacent to the second processor.

In some embodiment, the circuit board assembly further includes at least one the third circuit board. The third circuit board is placed between the first circuit board and the second circuit board. The third circuit board includes at least one third through hole. The first connecting wire passes through the third through hole.

In some embodiment, the circuit board assembly further includes a second connecting module. The third circuit board also includes a third processor. The second connecting module includes a second connecting wire, a third connector and a fourth connector. One end of the third connector is connected to one end of the second connecting wire. The other end of the third connector is connected to the first circuit board. One end of the fourth connector is connected to the other end of the second connecting wire. The other end of the fourth connector is connected to the third circuit board. The third connector is adjacent to the first processor, and the fourth connector is adjacent to the third processor.

In some embodiment, the circuit board assembly further includes a third connecting module. The third connecting module includes a third connecting wire, a fifth connector and a sixth connector. One end of the fifth connector is connected to one end of the third connecting wire. The other end of the fifth connector is connected to the second circuit board. One end of the sixth connector is connected to the other end of the third connecting wire. The other end of the sixth connector is connected to the third circuit board. The fifth connector is adjacent to the second processor, and the sixth connector is adjacent to the third processor.

In some embodiment, the first connector and the second connector are X-Beam connectors.

In some embodiment, the first connecting wire is a flexible printed circuit board.

In some embodiment, the first connector and the second connector are fixed to the first circuit board and the second circuit board by fasteners, respectively.

In some embodiment, the first connector and the second connector are fixed to the first circuit board and the second circuit board by latches, respectively.

The present disclosure has the following advantages:
1. Reducing the signal transmission path;
2. Improving the high-frequency and the high-speed data transmissions;
3. Lowering the manufacturing cost.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 2A:
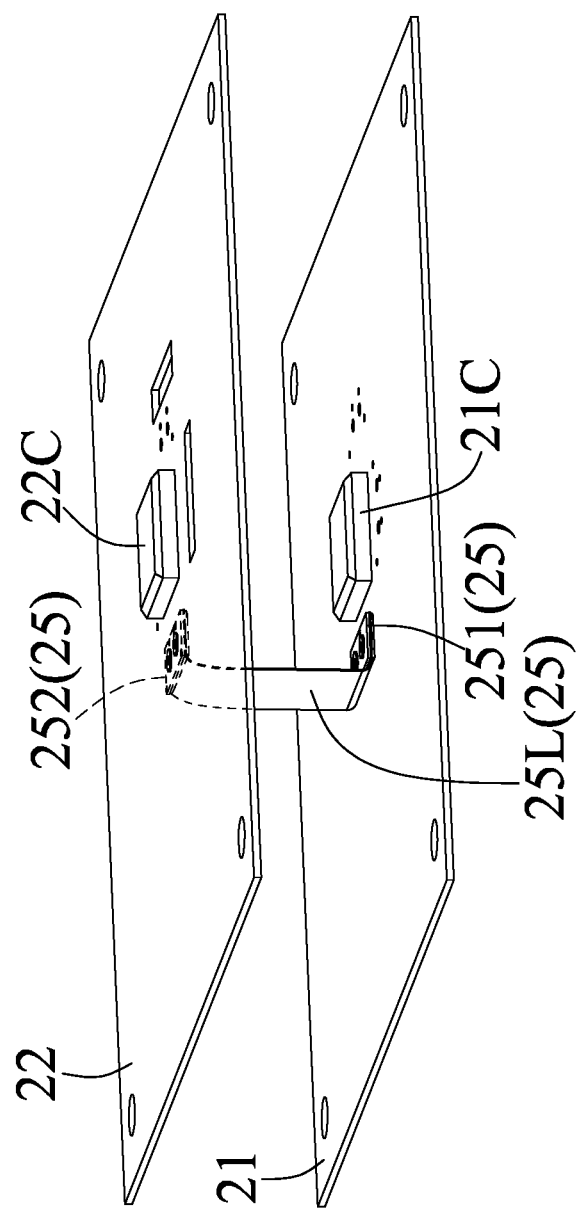
FIG. 2A illustrates a circuit board assembly 20 of the first embodiment.

Please refer to FIG. 2A. FIG. 2A illustrates a circuit board assembly 20 of the first embodiment. The circuit board assembly 20 includes a first circuit board 21, a second circuit board 22 and a first connecting module 25. The first circuit board 21 includes a first processor 21C, and the second circuit board 22 includes a second processor 22C. In FIG. 2A, the first processor 21C is disposed at the center of the first circuit board 21. However, in other embodiments, the first processor 21C is disposed elsewhere outside the center of the first circuit board 21, and the second processor 22C is also disposed elsewhere outside the center of the second circuit board 22.

Furthermore, the first connecting module 25 includes a first connecting wire 25L, a first connector 251 and a second connector 252. The first connecting wire 25L is such as a flexible printed circuit board. The first connector 251 and the second connector 252 are such as X-Beam connectors. The X-Beam connector having the advantages of high current carrying capacity and high-speed data transmissions is a product launched by Neoconix, Inc. in 2015.

Please refer to FIG. 2A. One end of the first connector 251 is connected to one end of the first connecting wire 25L, and the other end of the first connector 251 is fixed to the first circuit board 21 by fasteners. In addition, one end of the second connector 252 is connected to the other end of the first connecting wire 25L, and the other end of the second connector 252 is fixed to the second circuit board 22 by fasteners. In the embodiment, the fasteners are to achieve the fixing effect by screwing a bolt into a tapped hole.

Figure 2B:
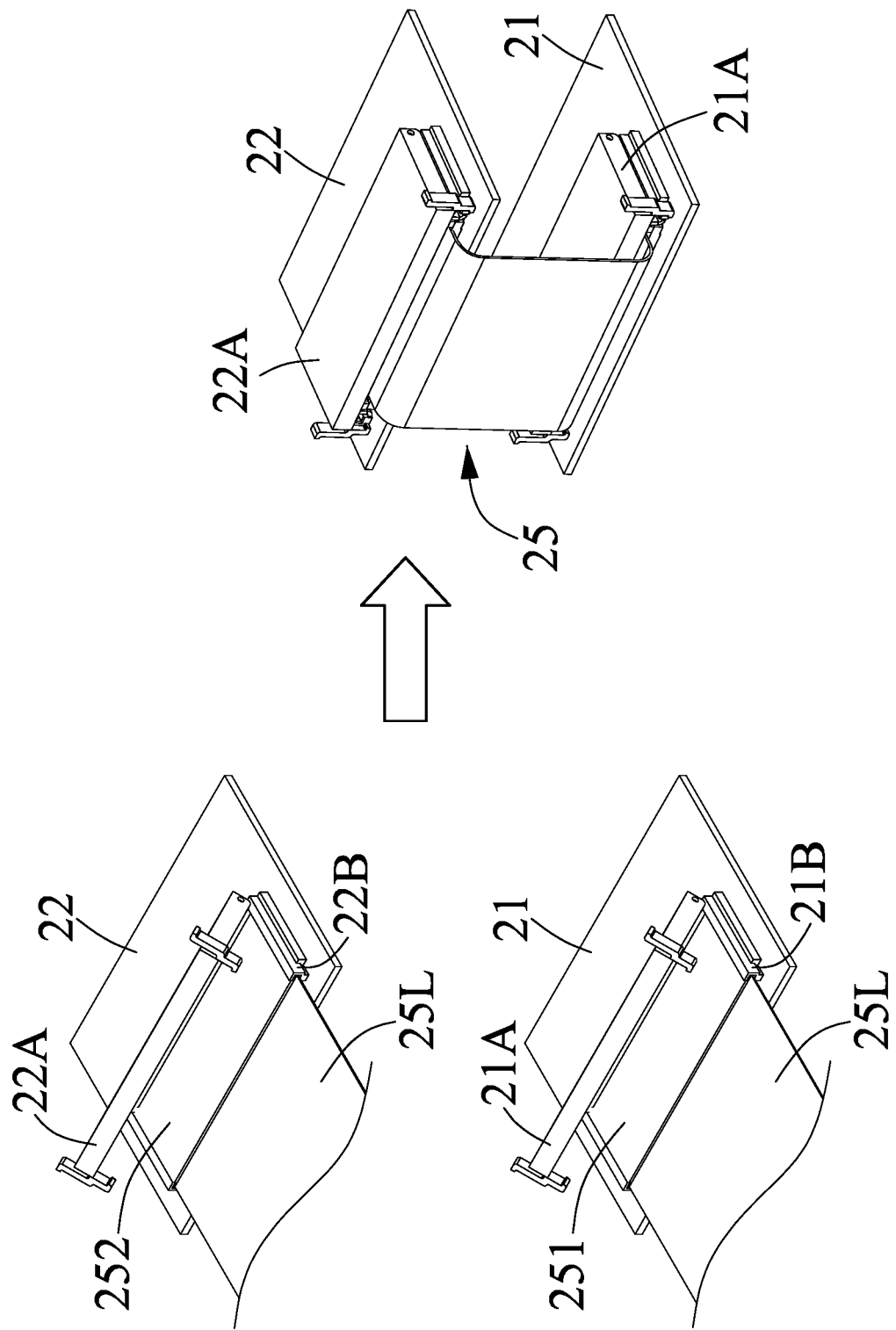
FIG. 2B illustrates a schematic view of a connector fixed to a circuit board by latches.

In other embodiments, as shown in FIG. 2B, the first connector 251 is fixed to the first circuit board 21 by latches, and the second connector 252 is also fixed to the second circuit board 22 by latches. In detail, the first connector 251 is embedded in a setting area 21B. Next, a cover 21A is locked down to the setting area 21B so that the cover 21A tightly presses the first connector 251. In the same or similar way, the second connector 252 is embedded in a setting area 22B. Then, a cover 22A is locked down to the setting area 22B so that the cover 22A tightly presses the second connector 252. As a result, it is advantageous for the first connector 251 and the second connector 252 to be quickly connected to or detached from the corresponding circuit board.

In the embodiment, in addition to being connected to the first circuit board 21, the first connector 251 is adjacent to the first processor 21C. Furthermore, besides being connected to the second circuit board 22, the second connector 252 is adjacent to the second processor 22C. Therefore, the first connecting module 25 can receive a signal from the first processor 21C at the nearest position of the first processor 21C, and the signal is directly transmitted to the vicinity of the second processor 22C of the second circuit board 22 via the first connecting module 25, significantly shorten the signal transmission path. Thus, the circuit board assembly 20 has positive impacts on the high-frequency and the high-speed data transmissions.

Figure 1:
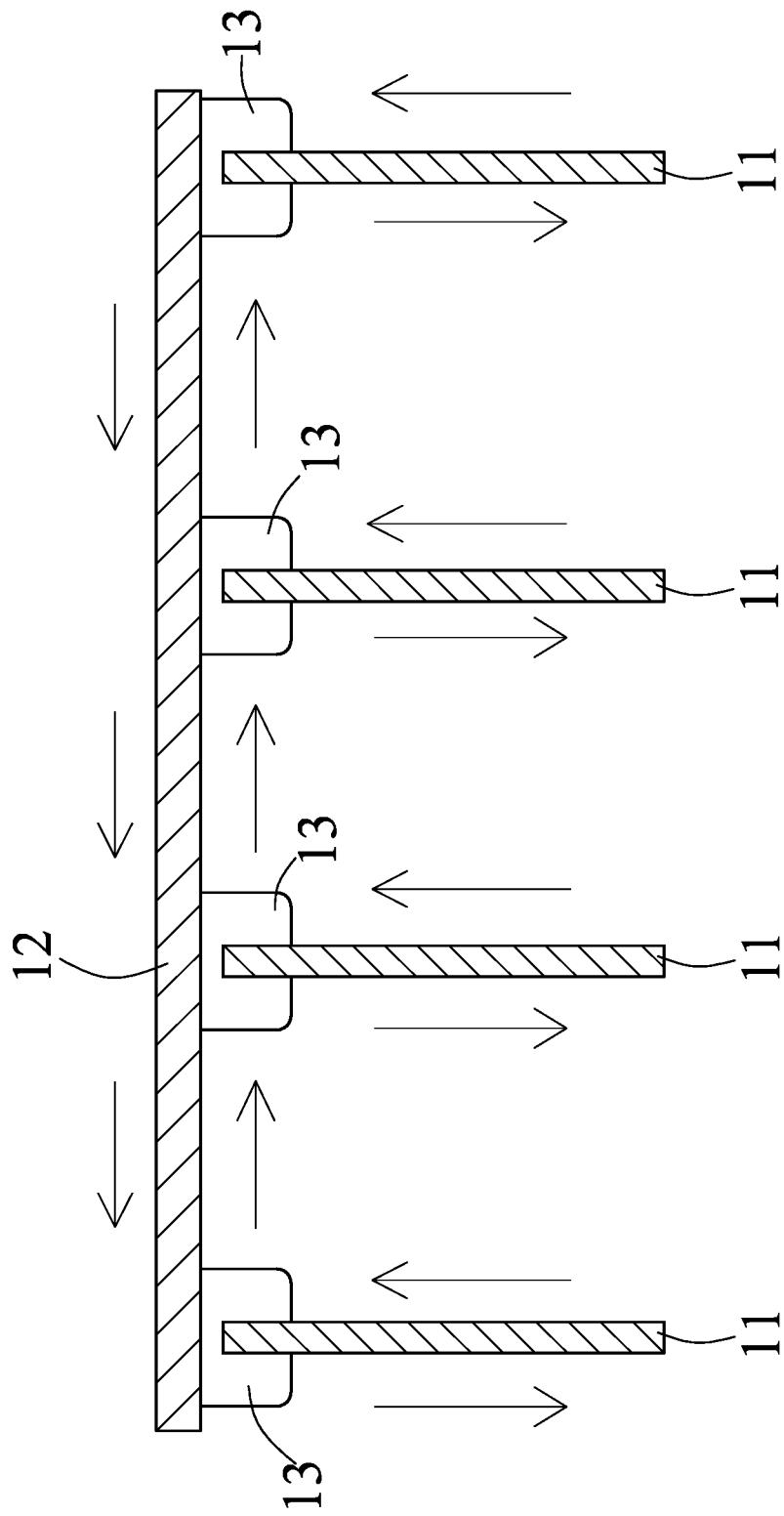
FIG. 1 illustrates a traditional circuit board assembly 10.

Please refer to FIG. 1. Compared to traditional circuit board assembly 10, the circuit board assembly 20 does not have the backplane 12 and a plurality of backplane connectors 13. As a result, the circuit board assembly 20 is made in a lower manufacturing cost.

Figure 3:
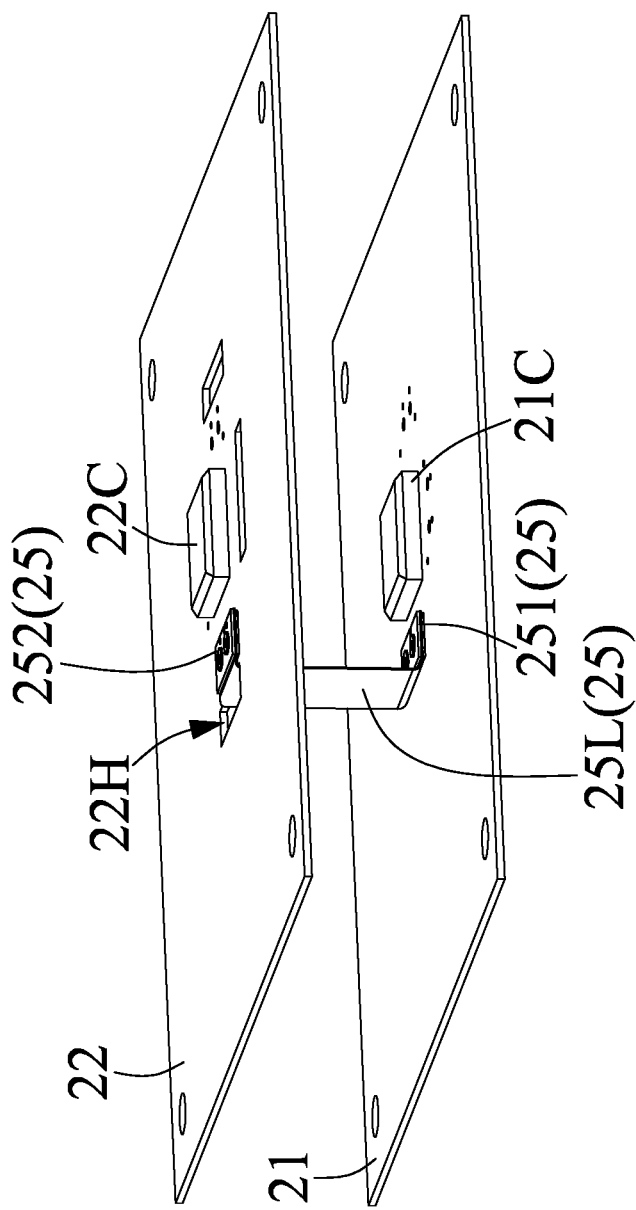
FIG. 3 illustrates a circuit board assembly 30 of the second embodiment.

Please refer to FIG. 3. FIG. 3 illustrates a circuit board assembly 30 of the second embodiment. The differences between the circuit board assembly 30 and the circuit board assembly 20 are the second circuit board 22 of the circuit board assembly 30 further including a second opening 22H and the first connecting wire 25L of the circuit board assembly 30 passing through the second through hole 22H. Specifically, in the circuit board assembly 30, by making the hole on the circuit board the first connecting module 25 is able to being directly connected to the second processor 22C. Therefore, via the second through hole 22H, the first connecting module 25 is directly connected to the vicinity of the second processor 22C, greatly reducing the signal transmission path.

Figure 4:
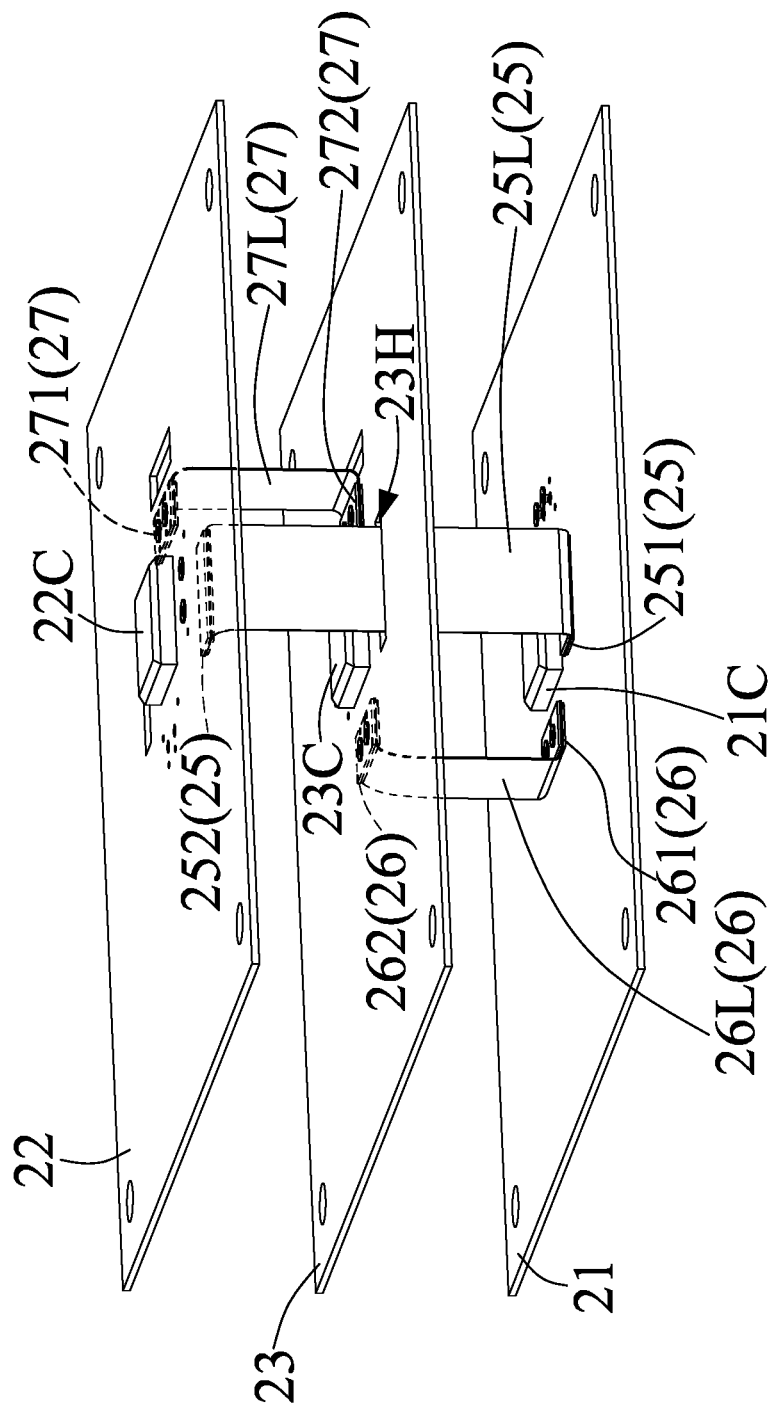
FIG. 4 illustrates a circuit board assembly 40 of the third embodiment.

Please refer to FIG. 4. FIG. 4 illustrates a circuit board assembly 40 of the third embodiment. The differences between the circuit board assembly 40 and the circuit board assembly 20 are the circuit board assembly 40 including a third circuit board 23 and a second connecting module 26 and a third connecting module 27. The third circuit board 23 is placed between the first circuit board 21 and the second circuit board 22. The third circuit board 23 further includes a third processor 23C.

The second connecting module 26 of the circuit board assembly 40 includes a second connecting wire 26L, a third connector 261 and a fourth connector 262. One end of the third connector 261 is connected to one end of the second connecting wire 26L. The other end of the third connector 261 is connected to the first circuit board 21. The third connector 261 is adjacent to the first processor 21C.

In addition, one end of the fourth connector 262 is connected to the other end of the second connecting wire 26L. The other end of the fourth connector 262 is connected to the third circuit board 23. The fourth connector 262 is adjacent to the third processor 23C. Therefore, the second connecting module 26 can first receive a signal from the first processor 21C at the nearest position of the first processor 21C. And, the second connecting module 26 is directly connected to the vicinity of the third processor 23C of the third circuit board 23. In other words, compared to the prior art, the signal transmission path between the first circuit board 21 and the third circuit board 23 is greatly shortened.

Moreover, the third connecting module 27 of the circuit board assembly includes a third connecting wire 27L, a fifth connector 271 and a sixth connector 272. One end of the fifth connector 271 is connected to one end of the third connecting wire 27L. The other end of the fifth connector 271 is connected to the second circuit board 22. The fifth connector 271 is adjacent to the second processor 22C.

One end of the sixth connector 272 is connected to the other end of the third connecting wire 27L. The other end of the sixth connector 272 is connected to the third circuit board 23. The sixth connector 272 is adjacent to the third processor 23C. Therefore, the third connecting module 27 can receive a signal from the second processor 22C at the nearest position of the second processor 22C. And, the third connecting module 27 is directly connected to the vicinity of the third processor 23C of the third circuit board 23. The signal transmission path between the second circuit board 22 and the third circuit board 23 is greatly shortened.

Please refer to FIG. 4. The third circuit board 23 includes a third through hole 23H. The first connecting wire 25L are passed through the third through hole. In other words, in the circuit board assembly 40, by making the hole on the circuit board the first connecting module 25 is also able to being directly connected to the second processor 22C. Therefore, via the third through hole 23H, the first connecting module 25 is directly connected to the vicinity of the second processor 22C. As a result, the signal transmission path between the first circuit board 21 and the second circuit board 22 is greatly shortened.

In the above embodiment, it is not mentioned how to fix and position each circuit board in the circuit board assembly. The following introduces how to use the support structure 8 to fix and position each circuit board with reference to FIG. 5A and FIG. 5B.

Figure 5A:
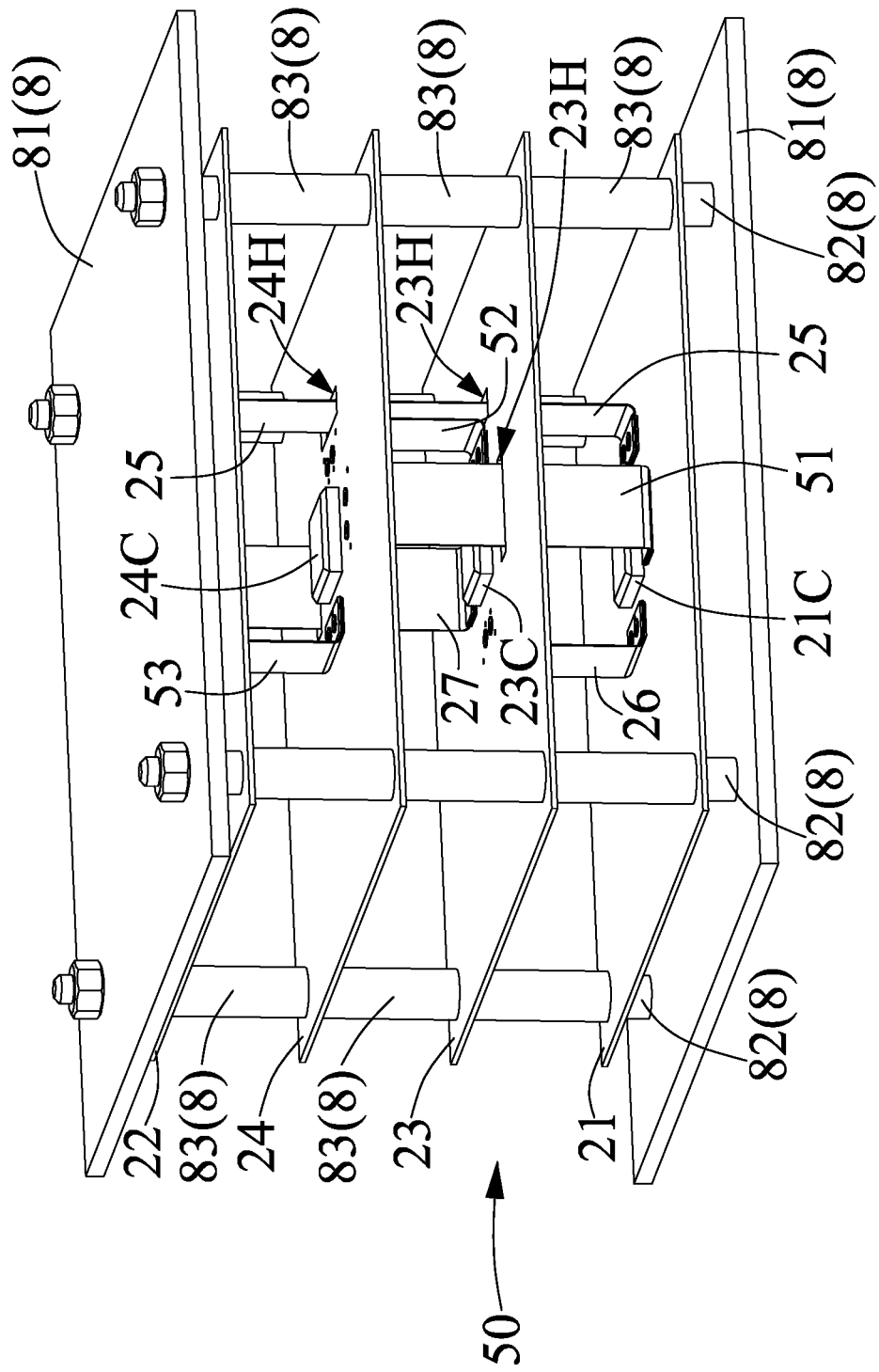
FIG. 5A illustrates a schematic view of a circuit board assembly 50 and a support structure 8.
Figure 5B:
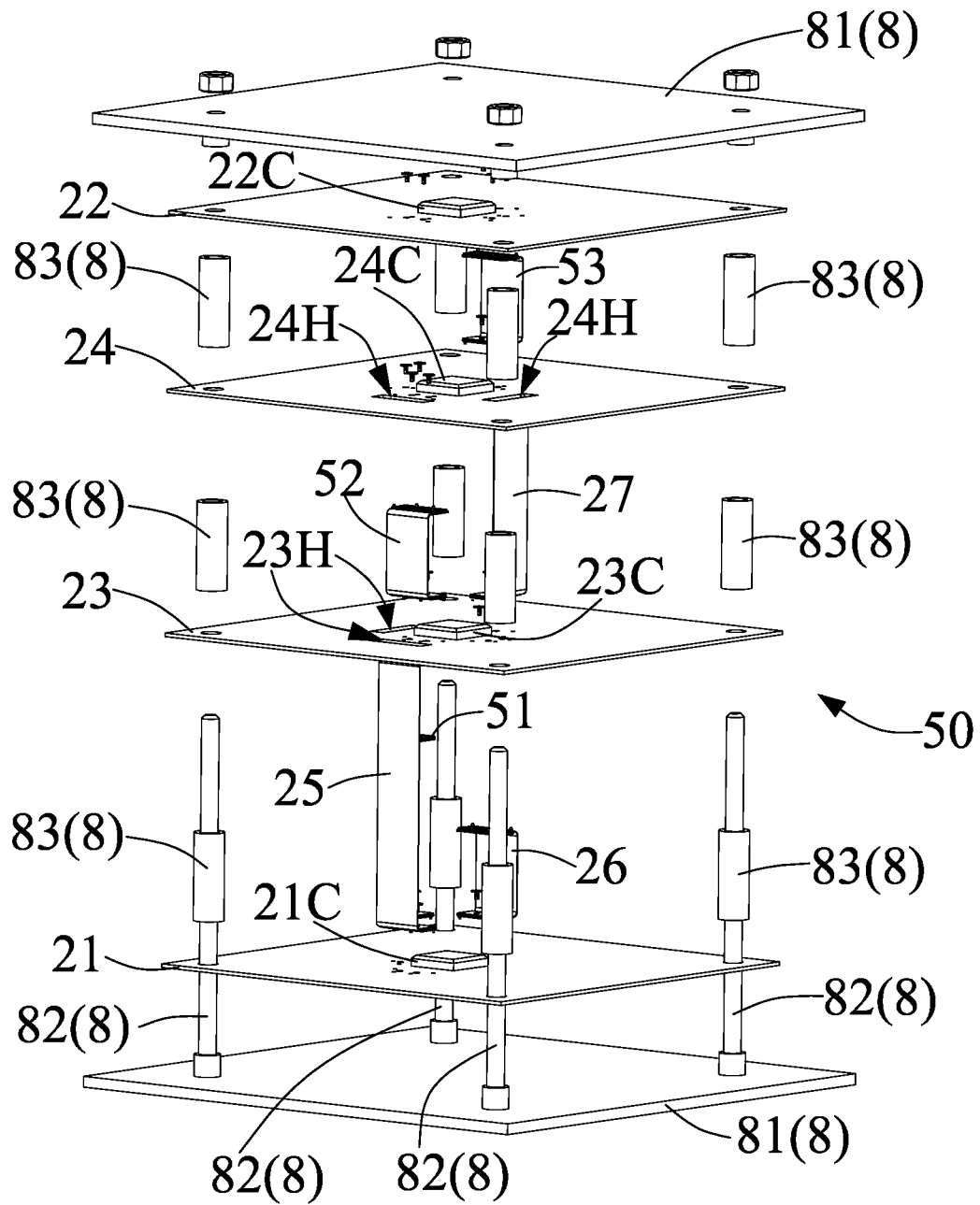
FIG. 5B illustrates an explosion diagram of the circuit board assembly 50 and the support structure 8.

Please refer to FIG. 5A and FIG. 5B. FIG. 5A illustrates a schematic view of a circuit board assembly 50 and a support structure 8. FIG. 5B illustrates an explosion diagram of the circuit board assembly 50 and the support structure 8. Compared to the circuit board assembly 40, are the circuit board assembly further includes a fourth connecting module 51, a fifth connecting module 52, a sixth connecting module 53 and another third circuit board 24. In the embodiment, the circuit boards disposed between the first circuit board 21 and the second circuit board 22 are all defined as the third circuit board, and different symbols are used to distinguish them. The third circuit board 24 is disposed between the second circuit board 22 and the third circuit board 23. The third circuit board 24 includes a third processor 24C and a plurality of third through hole 24H. The first connecting module 25 connects the first circuit board 21 and the second circuit board 22 by passing through the third through hole 23H and the third through hole 24H. Therefore, the signal transmission path between the first circuit board 21 and the second circuit board 22 is greatly shortened.

In the embodiment, the third connecting module 27 passes through the third through hole 24H to connect the second circuit board 22 and the third circuit board 23. Furthermore, the first circuit board 21 and the third circuit board 23 of the circuit board assembly 50 are also connected by the second connecting module 26.

Moreover, the fourth connecting module 51 connects the first circuit board 21 and the third circuit board 24 by passing through the third through hole 23H. The fifth connecting module 52 connects the first third circuit board 23 and the second third circuit board 24, and the sixth connecting module 53 connects the second circuit board 22 and the third circuit board 24. Therefore, the signal is transmitted in the shortest path between each circuit board in the circuit board assembly 50.

In the above, FIG. 2A and FIG. 3 illustrate the embodiment of two circuit boards, FIG. 4 illustrates the embodiment of three circuit boards and FIG. 5A illustrates the embodiment of four circuit boards. However, the scope of the present invention includes but is not limited to those embodiments illustrated in FIG. 2A, FIG. 3, FIG. 4 and FIG. 5A.

Please refer to FIG. 5A and FIG. 5B. The support structure 8 includes two locking plates 81, four supporting columns 82 and a plurality of support bushings 83. The four supporting columns 82 and the plurality of support bushings 83 are used to fix and keep the first circuit board 21, the second circuit board 22, the third circuit board 23, and the third circuit board 24 in their corresponding positions in the circuit board assembly 50. The two locking plates 81 of the support structure 8 are placed below the first circuit board 21 and above the second circuit board 22, respectively. The upper and lower locking plates 81 are used to fix and keep the four supporting columns 82.

In other embodiment, the first circuit board 21, the second circuit board 22, the third circuit board 23, and the third circuit board 24 are fixed by the backplane 12 and the backplane connectors 13 in FIG. 1. However, the backplane 12 and the backplane connectors 13 are only used for fixing the circuit board assembly 50 and not used for signal transmission in the embodiment.

Figure 6A:
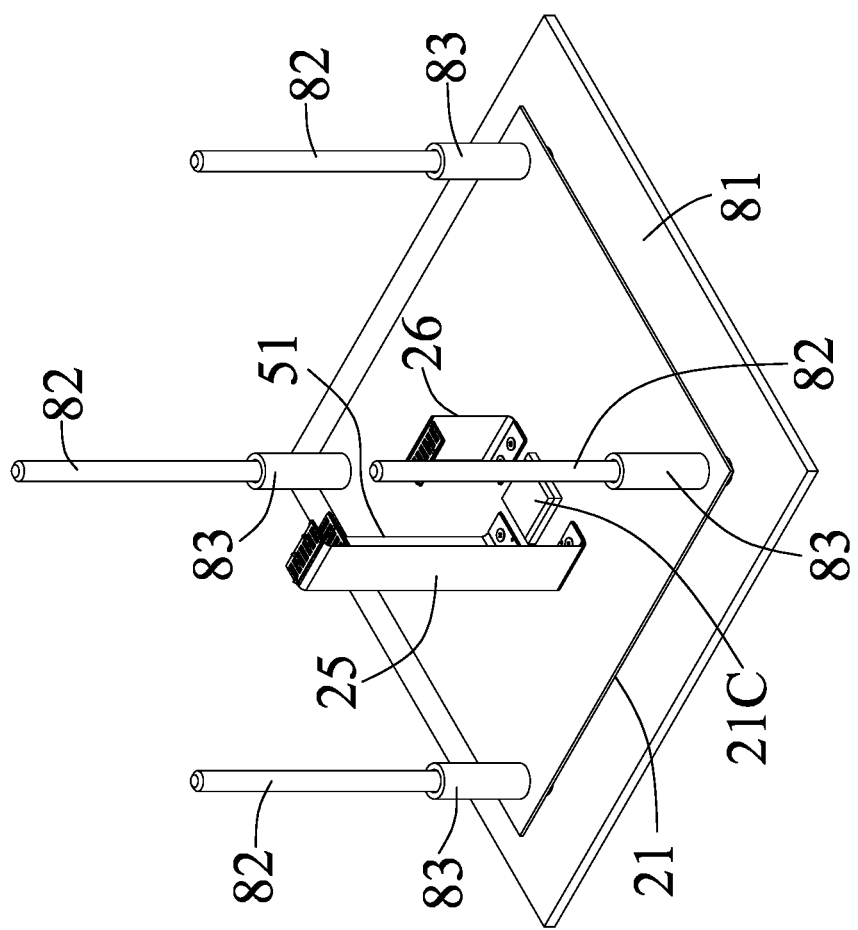
FIG. 6A to FIG. 6D illustrate a flow chart for manufacturing the circuit board assembly 50.

Hereinafter, the manufacturing or assembly method of the circuit board assembly 50 is described. First, please refer to FIG. 6A. A locking plate 81, four supporting columns 82, four support bushings 83, and a first circuit board 21 are provided. The four support columns 82 are disposed at the locking plate 81. The four supporting columns 82 respectively are passed through the four corners of the first circuit board 21 so that the first circuit board 21 is disposed above the locking plate 81. Next, one ends of the first connecting module 25, the second connecting module 26 and the fourth connecting module 51 are connected to the first circuit board 21. The connection points of the first connecting module 25, the second connecting module 26, and the fourth connecting module 51 to the first circuit board 21 are adjacent to the first processor 21C. Furthermore, each of the four interval rings 83 is placed around or sheathing the corresponding supporting column 82 so that each interval ring 83 is disposed above the first circuit board 21.

Figure 6B:
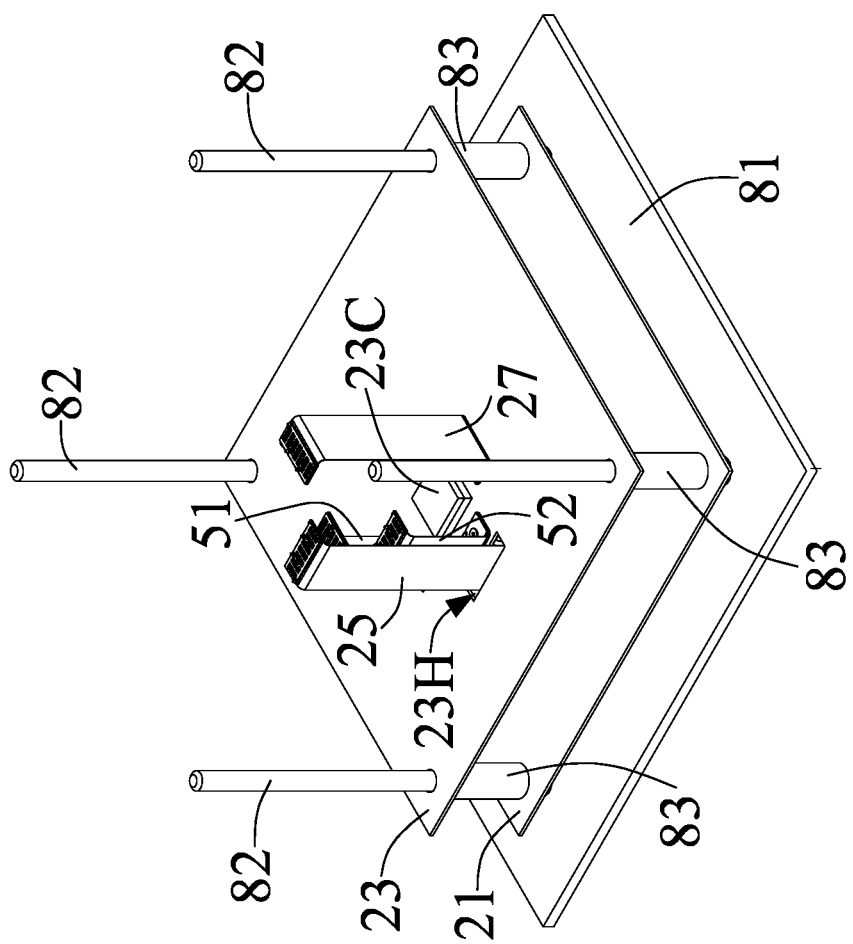

Please refer to FIG. 6B. The third circuit board 23, the fifth connecting module 52 and the third connecting module 27 are provided. The four supporting columns 82 respectively are passed through the four corners of the third circuit board 23. In addition, the third circuit board 23 is above the first circuit board 21. Then, the first connecting module 25 and the fourth connecting module 51 are passed through the third through hole 23H of the third circuit board 23. Then, the other end of the second connecting module 26 is connected to the lower surface of the third circuit board 23. Next, one ends of the fifth connecting module 52 and the third connecting module 27 are connected to the upper surface of the third circuit board 23. The connection point between the fifth connecting module 52 and the third circuit board 23 and the connection point between the third connecting module 27 and the third circuit board 23 are adjacent to the third processor 23C.

Figure 6C:
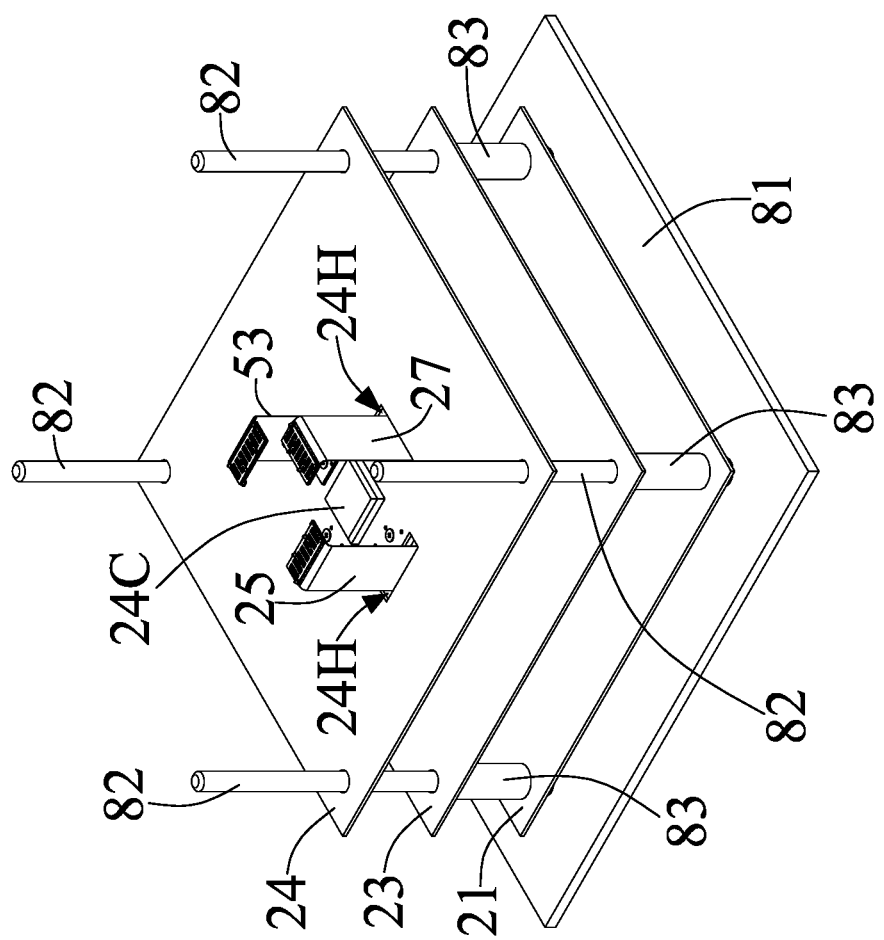

Please refer to FIG. 6C. The second third circuit board 24 and the sixth connecting module 53 are provided. The four supporting columns 82 respectively are passed through the four corners of the third circuit board 24. In addition, the third circuit board 24 is above the third circuit board 23. Then, the first connecting module 25 and the third connecting module 27 are passed through the third through hole 24H of the third circuit board 24. Thereafter, one end of the sixth connecting module 53 is connected to the lower surface of the third circuit board 24. After that, the connection point between the sixth connecting module 53 and the third circuit board 24 is adjacent to the third processor 24C. Next, the other ends of the fifth connecting module 52 and fourth connecting module 51 are connected to the lower surface of the third circuit board 23.

Figure 6D:
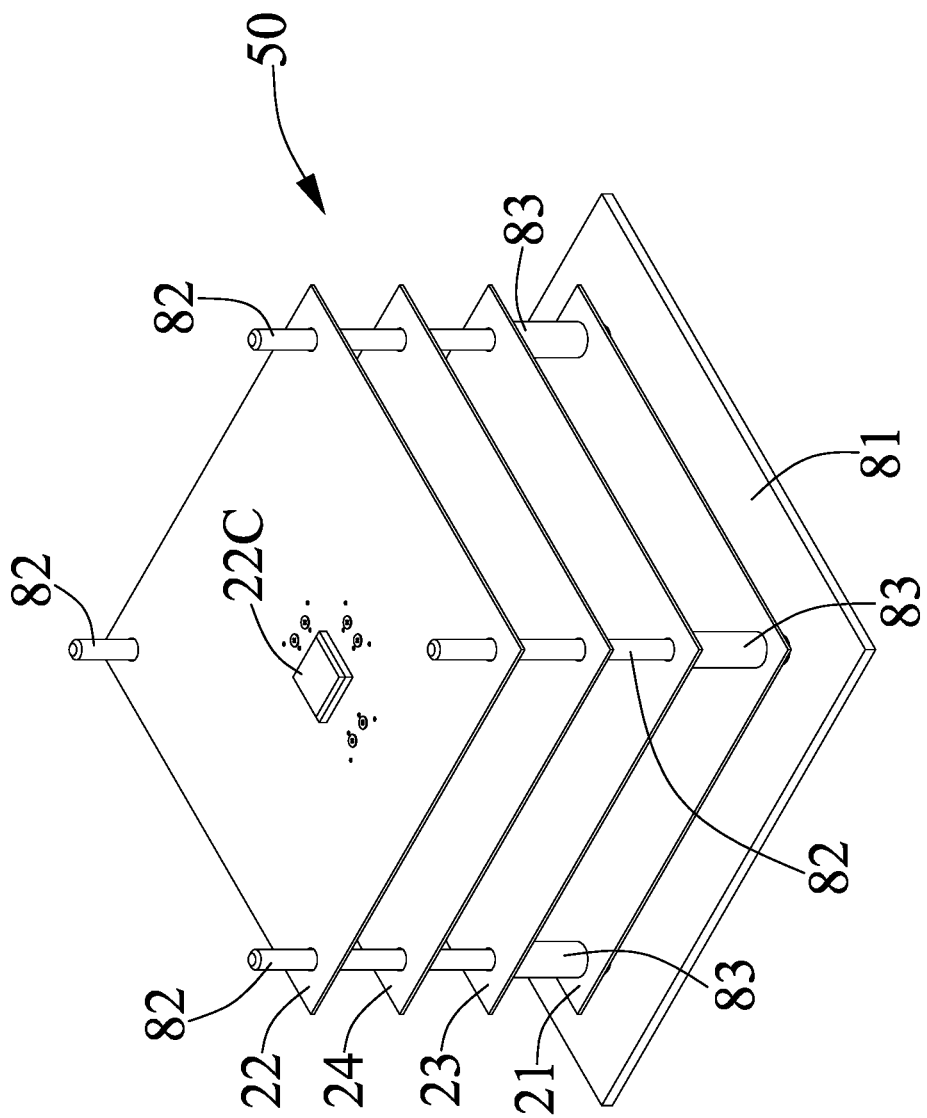

Please refer to FIG. 6D. The second circuit board 22 is provided. The four supporting columns 82 respectively are passed through the four corners of the second circuit board 22. The second circuit board 22 is above the third circuit board 24. The other ends of the first connecting module 25, the third connecting module 27 and the sixth connecting module 53 are connected to the lower surface of the second circuit board 22. The connection points of the first connecting module 25, the third connecting module 27 and the sixth connecting module 53 to the second circuit board 22 are adjacent to the second processor 22C. In this way, the manufacture of the circuit board assembly 50 in the embodiment is completed.

In summary, compared to prior art, the circuit board assembly in the present disclosure can reduce the signal transmission path, have positive impacts on the high-frequency and the high-speed data transmissions, and lower the manufacturing cost thereof.

Although the description above contains many specifics, these are merely provided to illustrate the invention and should not be construed as limitations of the invention's scope. Thus, it will be apparent to those skilled, in the art that various modifications and variations can be made in the system and processes of the present disclosure without departing from the spirit or scope of the invention.

What is claimed is:

1. A circuit board assembly, comprising:
    a first circuit board, comprising a first processor;
    a second circuit board, comprising a second processor and at least one second through hole; and
    a first connecting module, comprising:
        a first connecting wire, passing through the second through hole;
        a first connector, one end of the first connector connected to one end of the first connecting wire, the other end of the first connector connected to the first circuit board; and
        a second connector, one end of the second connector connected to one end of the first connecting wire, the other end of the second connector connected to the second circuit board;
    wherein the first connector is adjacent to the first processor, and the second connector is adjacent to the second processor.

2. The circuit board assembly according to claim 1, further comprising at least one the third circuit board, wherein the third circuit board is placed between the first circuit board and the second circuit board, and the third circuit board comprises at least one third through hole, and the first connecting wire passes through the third through hole.

3. A circuit board assembly comprising:
    a first circuit board, comprising a first processor;
    a second circuit board, comprising a second processor and a second through hole;
    a third circuit board between the first circuit board and the second circuit board, the third circuit board comprising a third processor and a third through hole
    a first connecting module, comprising:
        a first connecting wire, passing through the second through hole and the third through hole;
        a first connector, one end of the first connector connected to one end of the first connecting wire, the other end of the first connector connected to the first circuit board; and
        a second connector, one end of the second connector connected to one end of the first connecting wire, the other end of the second connector connected to the second circuit board, wherein the first connector is adjacent to the first processor, and the second connector is adjacent to the second processor,
    a second connecting module comprising:
        a second connecting wire;
        a third connector, one end of the third connector connected to one end of the second connecting wire, the other end of the third connector connected to the first circuit board; and
        a fourth connector, one end of the fourth connector connected to the other end of the second connecting wire, the other end of the fourth connector connected to the third circuit board, wherein the third connector is adjacent to the first processor, and the fourth connector is adjacent to the third processor.

4. The circuit board assembly according to claim 3, further comprising a third connecting module, and the third connecting module comprising:
    a third connecting wire;
    a fifth connector, one end of the fifth connector connected to one end of the third connecting wire, the other end of the fifth connector connected to the second circuit board; and
    a sixth connector, one end of the sixth connector connected to the other end of the third connecting wire, the other end of the sixth connector connected to the third circuit board;
    wherein the fifth connector is adjacent to the second processor, and the sixth connector is adjacent to the third processor.

5. The circuit board assembly according to claim 1, wherein the first connector and the second connector are X-Beam connectors.

6. The circuit board assembly according to claim 1, wherein the first connecting wire is a flexible printed circuit board.

7. The circuit board assembly according to claim 1, wherein the first connector and the second connector are fixed to the first circuit board and the second circuit board by fasteners, respectively.

8. The circuit board assembly according to claim 1, wherein the first connector and the second connector are fixed to the first circuit board and the second connector by latches, respectively.

* * * * *